United States Patent [19]
Gardner et al.

[11] Patent Number: 6,057,209
[45] Date of Patent: *May 2, 2000

[54] SEMICONDUCTOR DEVICE HAVING A NITROGEN BEARING ISOLATION REGION

[75] Inventors: Mark I. Gardner, Cedar Creek; Mark C. Gilmer, Austin, both of Tex.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/891,278

[22] Filed: Jul. 10, 1997

[51] Int. Cl.$^7$ .................................................. H01L 21/76
[52] U.S. Cl. ............................ 438/427; 438/424; 438/433
[58] Field of Search ..................... 438/424, 425, 438/452, 303, 427, 430, 433, 437

[56] References Cited

U.S. PATENT DOCUMENTS

| | | | |
|---|---|---|---|
| 4,519,128 | 5/1985 | Chesebro et al. | 438/433 |
| 4,855,804 | 8/1989 | Bergami et al. | 257/622 |
| 4,931,409 | 6/1990 | Nakajima et al. | 438/430 |
| 5,116,779 | 5/1992 | Iguchi | 438/425 |
| 5,316,965 | 5/1994 | Philipossian et al. | 438/424 |
| 5,447,884 | 9/1995 | Fahey et al. | 438/437 |
| 5,492,858 | 2/1996 | Bose et al. | 438/437 |
| 5,563,091 | 10/1996 | Lee | 438/452 |
| 5,604,159 | 2/1997 | Cooper et al. | 438/430 |
| 5,646,063 | 7/1997 | Metha et al. | 438/425 |

FOREIGN PATENT DOCUMENTS

| | | |
|---|---|---|
| 0 362 779 | 4/1990 | European Pat. Off. . |
| 196 37 189 | 3/1997 | Germany . |

OTHER PUBLICATIONS

Nishizawa, H. et al., "An Advanced Dielectric Isolation Structure For SOI–CMOS/BiCMOS VLSIs", Abstract No. 822:1201–1202 (May 1993).

Nishizawa, H. et al., "Fully SiO$_2$ Isolated High Speed Self–Aligned Bipolar Transistor on Thin SOI", 1991 Symposium on VLSI Technology, Digest of Technical Papers, 3 pages (May 28–30, 1991).

Sugiyama, M. et al., "Bipolar VLSI Memory Cell Technology Utilizing BPSG–Filled Trench Isolation", *NEC Research & Development*, 298(94):8–12 (Jul. 1989).

*Primary Examiner*—Charles Bowers
*Assistant Examiner*—David S Blum

[57] ABSTRACT

A semiconductor device and manufacturing process in which a nitrogen bearing isolation region is formed. In one embodiment of the invention, a semiconductor device is formed by forming, in a substrate, one or more trenches each of which define an isolation region. In each trench, an insulating region is formed. In each trench over the insulating region, a nitrogen bearing region is formed. The nitrogen bearing region may, for example, be a nitride. A semiconductor device consistent with one embodiment of the invention includes a substrate having a plurality of active regions and one or more nitrogen bearing isolation regions separating the active regions. Each isolation region generally includes an insulating region adjacent the substrate and a nitrogen bearing region disposed over the insulating region and separated from the substrate by the oxide region. The nitrogen bearing region may, for example, be a nitride. The nitrogen bearing region in the isolation region generally enhances device performance and can, for example, reduce boron penetration of the isolation region.

31 Claims, 4 Drawing Sheets

SEMICONDUCTOR DEVICE HAVING A NITROGEN BEARING ISOLATION REGION

FIELD OF THE INVENTION

The present invention is directed generally to semiconductor devices and, more particularly, to a semiconductor device having a nitrogen bearing isolation region and a process of fabricating such a device.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applications in numerous disciplines. Such silicon-based semiconductor devices often include metal-oxide-semiconductor (MOS) transistors, complimentary MOS (CMOS) transistors, bipolar transistors, BiCMOS transistors, etc.

Each of these semiconductor devices generally include a semiconductor substrate on which a number of active devices are formed. The particular structure of a given active device can vary between device types. For example, in MOS transistors, an active device generally includes source and drain regions and a gate electrode which modulates current between the source and drain regions. In bipolar transistors, an active device generally includes a base, a collector, and an emitter.

One important step in the formation of semiconductors is the process of electrically isolating adjacent active devices. One known technique for isolating active devices on a semiconductor substrate is LOCOS (for LOCal Oxidation of Silicon) isolation. LOCOS isolation generally involves the formation of a recessed or semi-recessed oxide in the nonactive (or isolation) areas of the substrate which separate the active devices. One alternative to LOCOS isolation is trench isolation. Trench isolation generally involves etching shallow trenches in isolation regions of the substrates and refilling the trenches with a deposited silicon dioxide layer.

In both LOCOS and trench isolation processes, an implant is typically performed to provide a channel stop doping layer beneath the isolation oxide region. In NMOS device regions, a p-type dopant such as boron is typically used, while in PMOS device regions (and in n-wells of CMOS devices) an n-type dopant such as arsenic is typically used. The use of a channel stop generally improves device performance, but nevertheless is associated with some problems. For example, when boron is used to form a channel stop, the boron readily diffuses into the isolation oxide region during subsequent heating of the substrate. This places significant limitations on the processing steps used to fabricated the semiconductor device and, in particular, significantly limits the thermal processing of a device.

SUMMARY OF THE INVENTION

Generally, the present invention relates to a semiconductor device and manufacturing process in which a nitrogen bearing isolation region is formed. The nitrogen in the isolation region generally enhances device performance and can, for example, reduce boron penetration of the isolation region. In one embodiment of the invention, a semiconductor device is formed by forming, in a substrate, one or more trenches each of which define an isolation region. In each trench, an insulating region is formed. In each trench over the insulating region, a nitrogen bearing region is formed. The nitrogen bearing region may, for example, be a nitride.

A semiconductor device consistent with one embodiment of the invention includes a substrate having a plurality of active regions and one or more nitrogen bearing isolation regions separating the active regions. Each isolation region generally includes an insulating region adjacent the substrate and a nitrogen bearing region disposed over the insulating region and separated from the substrate by the insulating region. The nitrogen bearing region may, for example, be a nitride.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1A:
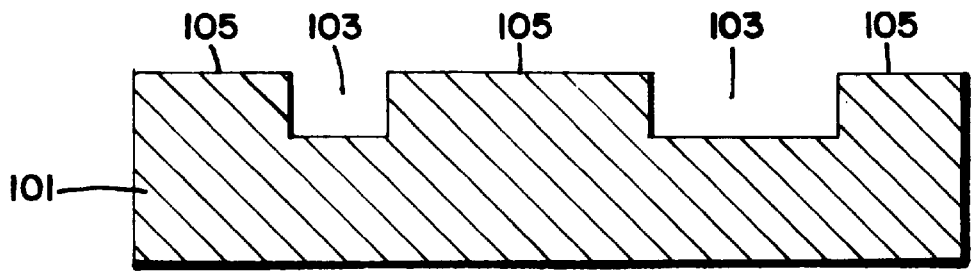
FIGS. 1A–1H illustrate a fabrication process in accordance with one embodiment of the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention is believed to be applicable to a number of semiconductor devices which employ isolation regions to separate active device regions. Such semiconductor devices may include MOS, CMOS, bipolar, and BiCMOS devices, for example. While the present invention is not so limited, an appreciation of various aspects of the invention will be gained through a discussion of the fabrication process in connection with the examples provided below.

FIGS. 1A–1H illustrate a process for fabricating an isolation region of a semiconductor substrate in accordance with one embodiment of the invention. As illustrated in FIG. 1A, trenches 103 are formed in a substrate 101. The trenches 103 may be formed using, for example, well-known photolithography and etching techniques. In one embodiment, a thin insulating layer, such as $SiO_2$, is formed over the surface of the substrate 101, using, for example, well-known deposition or oxide growth techniques. A mask is formed over the insulating layer and patterned to expose areas of the substrate 101 where trenches 103 are to be formed. Portions of the substrate 101 in the exposed areas are then removed using, for example, well-known etching techniques, to form the trenches 103. The mask and insulating layer are then removed to form the structure depicted in FIG. 1A.

The trenches 103 generally define regions used to form isolation regions for electrically isolating active regions 105 of the substrate 101. As used herein, the term active region will be used to describe regions of the substrate on which active devices such as bases, collectors, emitters, source/drain regions or gate electrodes are formed. The depth of the trenches 103 may be suitably selected in consideration of the desired depth of the isolation region to be formed. Thicknesses ranging from about 0.1 to 0.4 microns would be suitable for many applications.

Figure 1B:
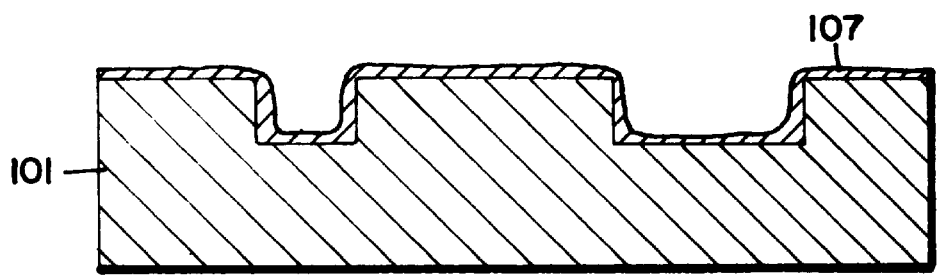

An insulating layer 107 is formed over the substrate 101 and in the trenches 103, as illustrated in FIG. 1B. The insulating layer 107 may, for example, be an oxide such as $SiO_2$ formed using well-known deposition or growth techniques. In other embodiments, the insulating layer 107 may be a nitrogen bearing oxide. A nitrogen bearing oxide may, for example, be formed by oxide deposition or oxide growth in a nitrogen bearing ambient. The insulating layer 107 will be used to insulate the surface of the substrate 101 from a nitrogen bearing layer. The thickness of the insulating layer 107 may be selected in consideration of the desired separation of the nitrogen bearing layer from the substrate surface. Thicknesses of the insulating layer 107 ranging from about 50 to 200 Angstroms (Å) would be suitable for many applications.

Figure 1C:
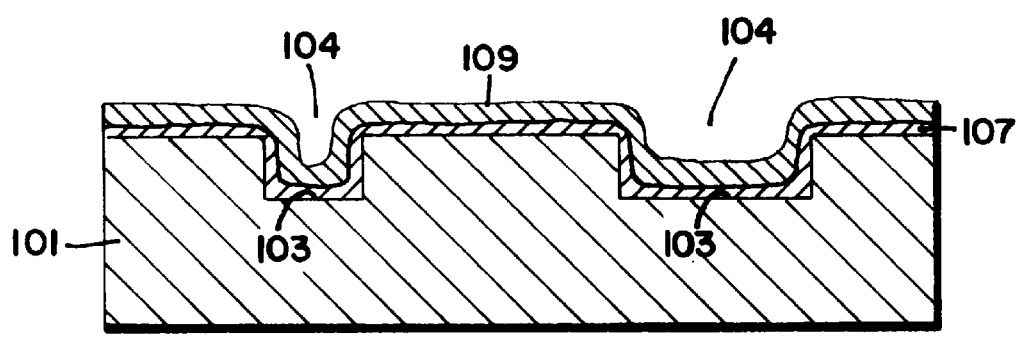

A nitrogen bearing layer 109 is formed over the insulating layer 107 and in the trenches 103, as illustrated in FIG. 1C. The nitrogen bearing layer 109 may be formed using, for example, well-known deposition techniques. The nitrogen bearing layer 109 typically partially fills the trenches 103, leaving an unfilled portion 104 in each trench 103. Suitable thicknesses of the nitrogen bearing layer 109 range from about 50 to 1000 Å for many applications. The nitrogen bearing layer may, however, completely fill the trenches 103 if desired.

The nitrogen bearing layer 109 is generally used to enhance device performance by, for example, suppressing diffusion of channel stop dopants into the isolation region. The concentration of nitrogen in the nitrogen bearing layer 109 is suitably selected in consideration of the desired suppression of channel stop dopant diffusion. Suitable nitrogen concentrations range from about 1% and up. In one particular embodiment, the nitrogen bearing layer 109 is a nitride, such as silicon nitride. The nitride may, for example, be deposited using well-known techniques. The use of a deposited nitride layer provides a relatively uniformal deposition and allows relatively easy filling of unfilled portions 104 of the trenches 103 in subsequent processing.

Figure 1D:
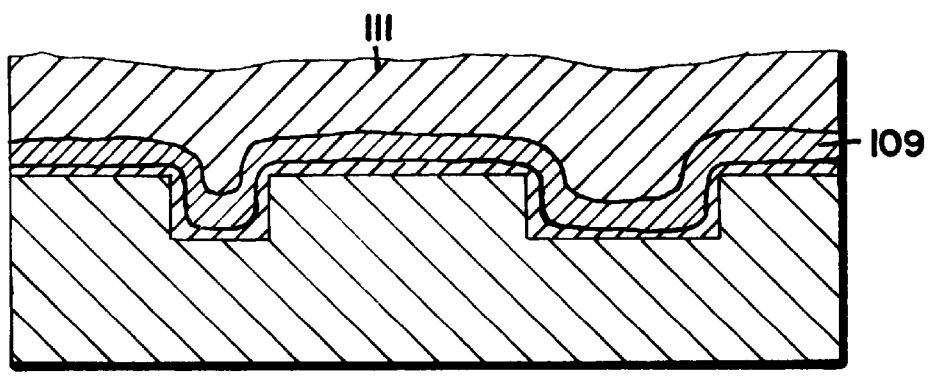

A second insulating layer 111 is formed over the nitrogen bearing layer 109 in order to fill any unfilled portions 104 of the trenches 103. The resultant structure is illustrated in FIG. 1D. The second insulating layer 111 may, for example, be an oxide such as $SiO_2$ formed using well-known deposition techniques. The thickness of the second insulating layer 111 is suitably selected in consideration of the depth of the unfilled portions 106 of the trenches 103. Suitable thicknesses of the second insulating layer 111 range from about 5,000 to 10,000 Å, for example.

In some embodiments, spacers, such as an oxide spacers, may be formed on the vertical edges of the nitrogen bearing layer 109 within the trenches 103 prior to forming the second insulating layer 111. The spacers may, for example, be formed by depositing and etching an oxide layer using well-known deposition and etching techniques.

Figure 1E:
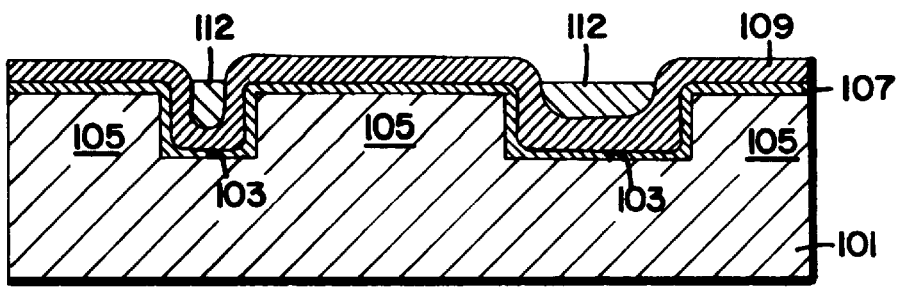

A portion of the second insulating layer 111 is then removed, leaving portions 112 of the insulating layer 111 in the trenches 103 and exposing portions of the nitrogen bearing layer 109 over the active regions 105 of the substrate 101. The resultant structure is shown in FIG. 1E. Removal of the second insulating layer 111 may be done using a number of well-known techniques. The use of a deposited nitride as the nitrogen bearing layer 109 facilitates use of a polish technique and provides a more uniform filling of the unfilled portions 104 of the trenches 103. The second insulating layer 111 may, for example, be removed such that the upper surfaces of the remaining portions 112 of the insulating layer 111 are at about the same level as the upper surface of the insulating layer 107.

Portions of the nitrogen bearing layer are removed over the active regions 105 of the substrate 101. This may be performed using, for example, well-known plasma or hot phosphoric stripping techniques. After removing the portions of the nitrogen bearing layer, the substrate 101 is implanted with a dopant to form channel stops 113 beneath the isolation trenches 103. In CMOS and BiCMOS devices, this may, for example, include masking n-well regions of the substrate (not shown) and implanting a p-type dopant, such as boron, at a sufficient energy to penetrate the isolation trenches 103 and form the channel stops 113. Suitable implantation energies and dosages for the p-well channel stop implant are about 200 KeV and 2–5E12 atoms/cm$^2$. The implant used to from the channel stops 113 may also be used to form p-well regions 115. A separate well implant may, however, be performed if desired.

Figure 1F:
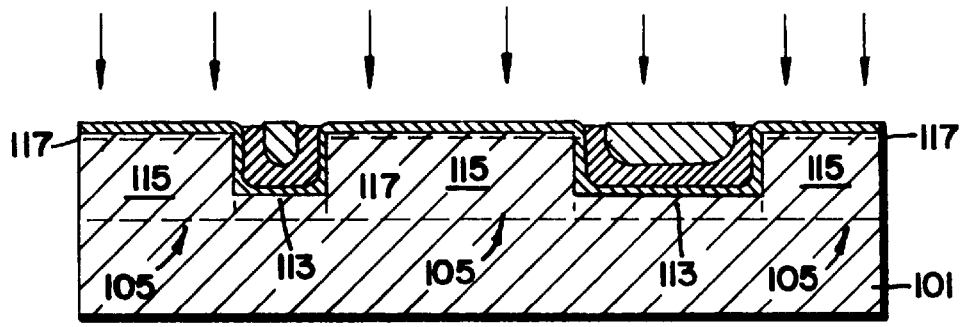
Figure 1G:
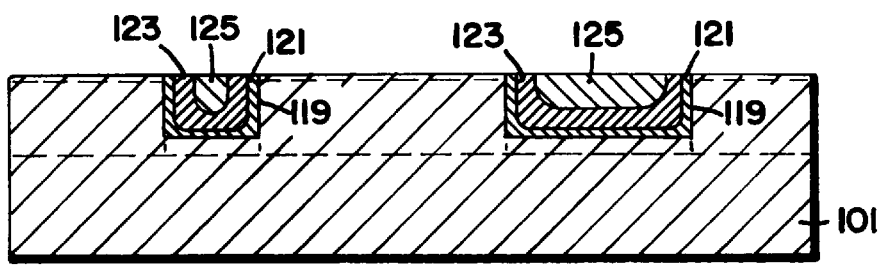

In addition, a punchthrough implant may be performed to provide dopants in the active regions 105, and a voltage threshold (VT) implant may be performed to provide a shallow dopant layer 117 near the substrate surface in the active regions 105. The resultant structure is depicted in FIG. 1F. Suitable implantation energies and dopant dosages for the punchthrough implant are about 75 KeV and 2–5E12 atoms/cm$^2$, for example. Suitable implantation energies and dopant dosages for the VT implant are about 25 KeV and 2–5E12 atoms/cm$^2$, for example. It should be appreciated that, in CMOS and BiCMOS devices, the n-well mask may be removed prior to the VT implant. In alternate embodiments, the well, VT, channel stop, and/or punchthrough implants may be performed prior to the removal of the nitrogen bearing layer 109 over the active regions 105.

Portions of the insulating layer 107 over the active regions 105 are removed using, for example, well-known techniques. The resultant structure, illustrated in FIG. 1G, includes isolation regions 119 each having an insulating region 121 adjacent the substrate 101, a nitrogen bearing region 123 disposed over the insulating region 121 and separated from the substrate 101 by the insulating region 121, and a second insulating region 125 disposed over the nitrogen bearing region 123.

Figure 1H:
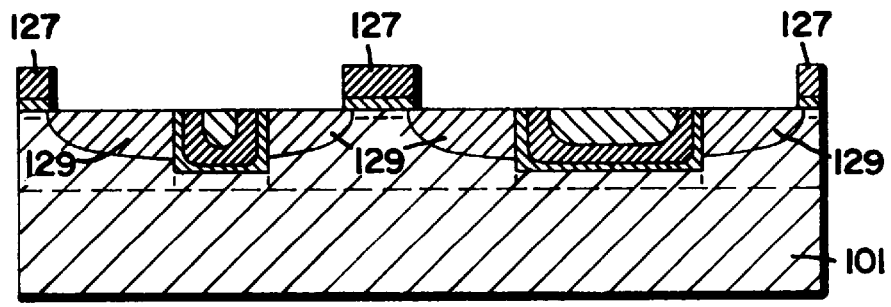

Fabrication may continue with conventional fabrication processes to complete the device structure. For example, gate electrodes and source/drain regions may be formed in the active regions 105, followed by silicidation, contact formation, and so forth. An exemplary structure depicting gate electrodes 127 and source/drain regions 129 is illustrated in FIG. 1H.

Using the above process, a nitrogen bearing region, such as a nitride region, can be incorporated in isolation regions of a semiconductor substrate. The nitrogen bearing isolation regions generally enhance device performance. In particular, by providing a nitrogen bearing region in an isolation region, dopant diffusion out of channel stops and into the isolation regions can be reduced as compared to conventionally-formed isolation regions. Reduction of such dopant diffusion is particularly predominant in boron doped channel stops.

The nitrogen in the isolation region further inhibits the migration of contaminants, such as sodium atoms, through the isolation region.

Moreover, the incorporation of nitrogen bearing region in isolation regions, allows more latitude in the processing of semiconductor devices. For example, by suppressing channel dopant diffusion into the isolation regions, channel stops can be subject to more thermal processing than channel stops formed with conventional techniques. This, for example, allows channel stop implants to be performed at earlier stages in device fabrication processes. Exemplary processing techniques illustrating earlier-formed channel stops are depicted in FIGS. 2A–2C and 3A–3C below. It should be appreciated that the processes illustrated in these figures are provided by way of example only and are not intended to limit the scope of the invention.

Figure 2A:
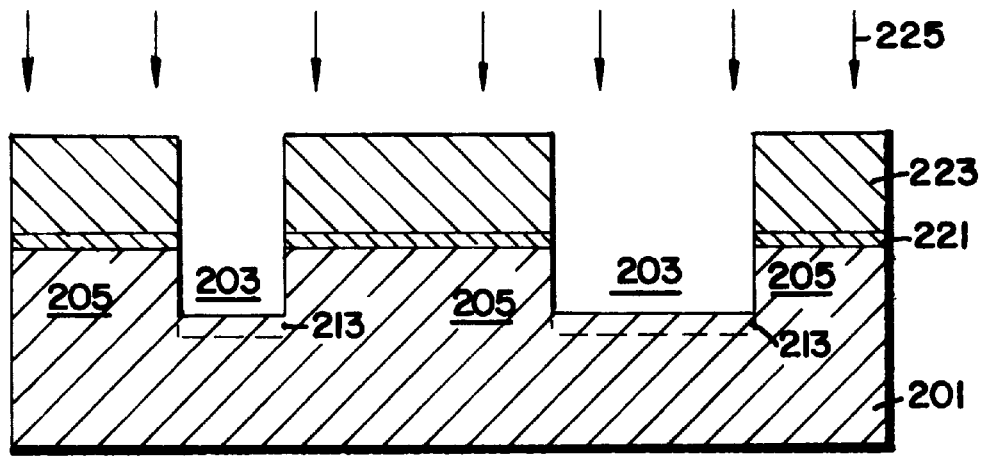
FIGS. 2A–2C illustrate a fabrication process in accordance with another embodiment of the invention.
Figure 2B:
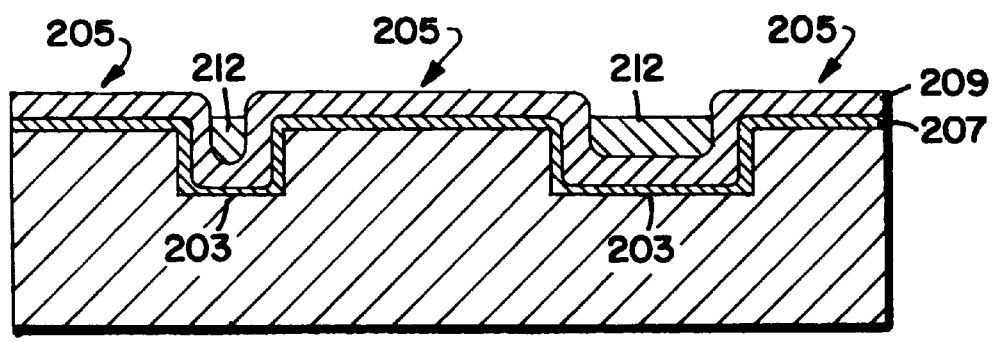
Figure 2C:
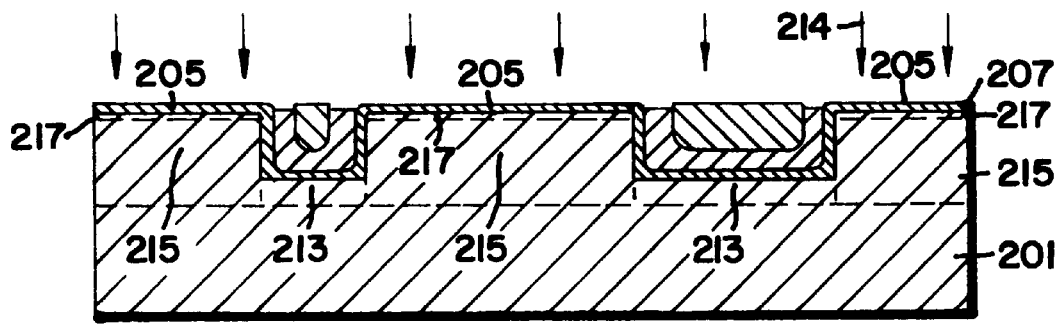

FIGS. 2A–2C illustrate an exemplary process for fabricating an isolation region of a semiconductor substrate. In this exemplary process, a thin insulating layer 221, such as $SiO_2$, is formed over the surface of a substrate 201. This may be done using convention deposition techniques, for example. A mask 223 is formed over the insulating layer 221 and patterned to expose areas of the substrate 201. Portions of the substrate 201 in the exposed areas are removed using, for example, known etching techniques, to form trenches 203. With the mask 223 on, the substrate 201 is implanted with a dopant (as illustrated by arrows 225) to form channel stops 213 beneath the trenches 203. The resultant structure is illustrated in FIG. 2A. Implantation energies and dopant dosages may be selected in consideration of the desired profile of the channel stops 213. Suitable implantation energies and dopant dosages are about 25 KeV and 2–5E12 atoms/cm$^2$ for many applications, respectively. It should be appreciated that, during the channel stop implant 225, the mask 223 generally prevents implantation of the dopant into the active regions 205 of the substrate 201.

The mask 223 and insulating layer 221 are removed, and a thin insulating layer 207 is formed over the substrate 201. A nitrogen bearing layer 209 is formed over the insulating layer 207 and in the trenches 203 as well. Any unfilled portions of the trenches 203 are then filled with an insulating material 212. The resultant structure is depicted in FIG. 2B. Formation of the thin insulating layer 207 and the nitrogen bearing layer 209 as well as filling of the trenches 203 with the insulating material 212 may, for example, be performed in a similar manner as discussed above with respect to FIGS. 1B–1E.

Portions of the nitrogen bearing layer 209 over the active regions 205 of the substrate 201 may be removed, and VT, well, and punchthrough implants (as illustrated by arrows 214) may be performed. The resultant structure, illustrated in FIG. 2C, includes wells 215 and VT doping layers 217. Implantation energies and dopant dosages of the well implant and VT implant may similar to those discussed above with respect to FIG. 1F. Processing may continue with the removal of the portions of the insulation layer 207 over the active regions 205, formation of active devices in the active regions, and so forth.

Figure 3A:
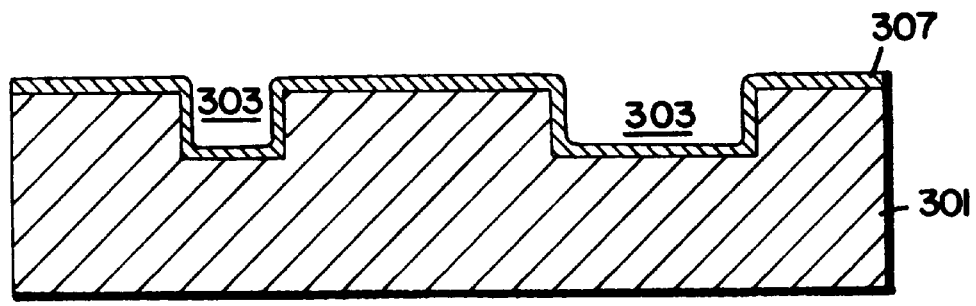
FIGS. 3A–3C illustrate a fabrication process in accordance with yet another embodiment of the invention.
Figure 3B:
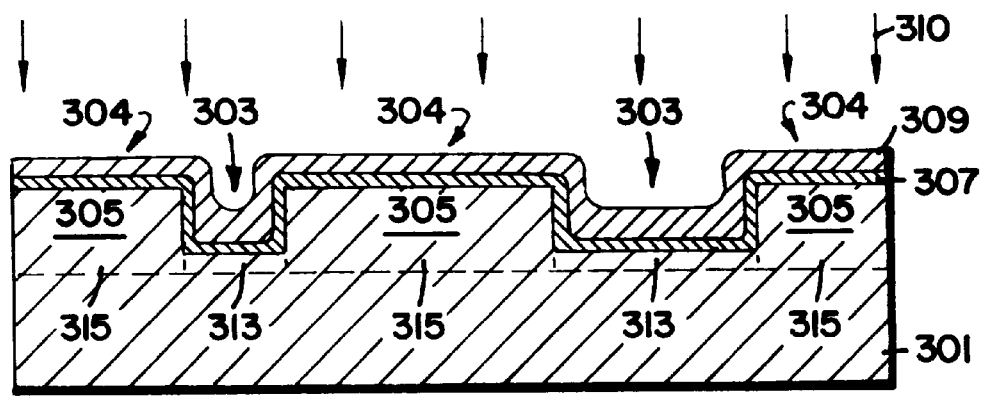
Figure 3C:
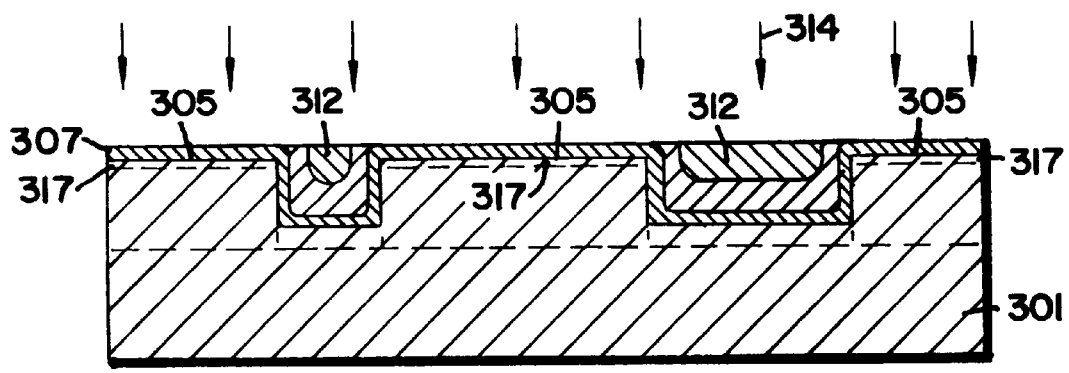

FIGS. 3A–3C illustrate another exemplary process of forming an isolation region in accordance with another embodiment of the invention. In accordance with this embodiment, trenches 303 are formed in the substrate 301 and an insulating layer 307 is formed over the substrate 301 and in the trenches 303. The resultant structure is illustrated in FIG. 3A. This may be done in a similar manner as discussed above with respect to FIGS. 1A–1B. A nitrogen bearing layer 309 is formed over the insulating layer 307 and in the trenches 303. The nitrogen bearing layer 309 may, for example, be formed in a similar manner as the nitrogen bearing layer 109 discussed above. Dopants are implanted (as illustrated by arrows 310) into the substrate to form channel stops 313 and well regions 315. The resultant structure is illustrate in 3B. Either one or two implants may be used to form the channel stops 313 and well regions 315.

The thickness of the nitrogen bearing layer 309 in the trenches 303 is typically sufficiently thick to ensure that dopants reach the substrate surface beneath the trenches 303 without providing the dopants near the surface of the substrate in the active regions 305. Suitable thicknesses of the portion of the nitrogen bearing layer 309 in the trenches 303 range from about 1,000 to 1,500 Å, for example. Suitable implantation energies and dopant concentrations for the implant(s) used to form the wells 315 and channel stops 313 are about 200 KeV and 2–5E12 atoms/cm for many applications, respectively.

Unfilled portions of the trenches 303 are filled with an insulating material 312 and portions of the nitrogen bearing layer 309 over the active regions 305 are removed. This may, for example, be performed in a similar manner as discussed above with respect to FIGS. 1D–1F. Dopants (as illustrated by arrows 314) may be implanted into the substrate 301 to form VT doped layers 317 in the active regions 305 of the substrate 301. The resultant structure is illustrated in FIGS. 3C. Suitable implantation energies and dopant dosages for the VT implant are about 25 KeV and 2–5E12 atoms/cm$^2$ for many applications, respectively. Processing may continue with the removal of portions of the insulation layer 307 over the active regions 305, formation of active devices in the active regions, and so forth.

Using the above two processes, channel stop implants can be performed at relatively early stages in isolation region formation without substantial diffusion of dopant out of the channel stop and into the isolation region. In particular, the channel dopant diffusion into the isolation regions is reduced as a result of the nitrogen in the isolation regions.

As noted above, the present invention is applicable to the fabrication of a number of different devices where an isolation region is formed in a substrate. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

What is claimed is:

1. A process of forming a semiconductor device, comprising:

forming at least one isolation trench in a substrate;

forming an insulating layer in the trench and on portions of the substrate surface adjacent the trench; and forming, in a single step, a nitrogen bearing layer on the insulating layer in the trench and on the insulating layer over the portions of the substrate surface adjacent the trench leaving an unfilled portion of the trench filling the unfilled portion of the trench with a second insulating layer to form an oxide region in the trench over the nitrogen bearing layer.

2. The process of claim 1, further including selectively removing portions of the second insulating layer to expose portions of the nitrogen bearing layer over the portions of the substrate surface adjacent the trench and to form an insulating region in the trench over the nitrogen bearing layer.

3. The process of claim 2, further including removing portions of the nitrogen bearing layer over portions of the substrate surface adjacent the trench, after removing portions of the second insulating layer.

4. The process of claim 3, further including implanting dopants into the substrate to form channel stops beneath the trench after removing portions of the nitrogen bearing layer.

5. The process of claim 3, further including implanting dopants into the substrate to form a channel stop beneath the trench before removing portions of the nitrogen bearing layer.

6. The process of claim 3, further including forming a channel stop beneath the trench before forming the insulating layer.

7. The process of claim 6, further including performing one or more dopant implants after removing the nitrogen bearing layer to form one or more doped regions in the substrate.

8. The process of claim 2, wherein selectively removing portions of the second insulating layer include leaving the insulating region with an upper surface about level with an upper surface of the insulating layer.

9. The process of claim 1, further including implanting dopants into the substrate to form channel stops beneath the trench after forming the nitrogen bearing layer and before forming the second insulating layer.

10. The process of claim 9, further including implanting dopants into the substrate to form well regions in the substrate after forming the nitrogen bearing layer and before forming the second insulating layer.

11. The process of claim 10, wherein a single implant is used to form the channel stops and the well regions.

12. The process of claim 9, wherein forming the nitrogen bearing layer includes forming the nitrogen bearing layer to a thickness in the trench ranging from about 1000 to 1500 Å.

13. The process of claim 1, further including forming spacers on sidewalls of the nitrogen bearing layer within the trench prior to forming the second insulating layer.

14. The process of claim 1, wherein forming the second insulating layer includes forming the second insulating layer to a thickness ranging from about 5000 to 10000 Å.

15. The process of claim 1, further including removing the insulating film before forming the insulating layer.

16. The process of claim 1, wherein forming the insulating layer includes forming an oxide layer.

17. The process of claim 1, wherein forming the nitrogen bearing layer includes forming a nitride layer.

18. The process of claim 1, wherein forming the nitrogen bearing layer includes forming the nitrogen bearing layer to a thickness ranging from about 50 to 2000 Å.

19. The process of claim 1, wherein the insulating layer is formed in a single step.

20. A process of forming a semiconductor device, comprising:

forming a first insulating layer over a substrate;

forming a patterned mask over the first insulating layer;

forming at least one trench in a substrate using the patterned mask, the trench defining an isolation region for isolating active regions;

removing the patterned mask;

forming a second insulating layer in the trench and over substrate regions adjacent the trench after removing the patterned mask;

depositing a nitride layer over the second insulating layer, the nitride layer being deposited in the trench and over substrate regions adjacent the trench depositing a third insulating layer over the nitrogen bearing layer, the third insulating layer being deposited in an unfilled portion of the trench and over the substrate regions adjacent the trench selectively removing portions of the third insulating layer to expose portions of the nitride layer over the substrate regions adjacent the trench and to form an oxide region in the trench over the nitride layer; and selectively removing exposed portions of the nitride layer.

21. The process of claim 20, further including implanting dopants into the substrate to form a channel stop beneath the trench after selectively removing exposed portions of the nitride layer.

22. The process of claim 20, further including implanting dopants into the substrate to form a channel stop beneath the trench before selectively removing exposed portions of the nitride layer.

23. The process of claim 22, wherein the dopants are implanted after depositing the nitride layer and before depositing the third insulating layer.

24. The process of claim 23, further including implanting dopants into the substrate to form well regions in the substrate after depositing the nitride layer and before forming the third insulating layer.

25. The process of claim 23, wherein forming the nitride layer includes forming the nitride layer to a thickness in the trench ranging from about 1000 to 1500 Å.

26. The process of claim 22, wherein the dopants are implanted before depositing the nitride layer.

27. The process of claim 26, wherein the dopants are implanted before removing the patterned mask and after forming the trench.

28. The process of claim 20, wherein the second insulating layer is formed in the trench and over the substrate regions adjacent the trench in a single step.

29. The process of claim 20, wherein the nitride layer is deposited in the trench and over the substrate regions adjacent the trench in a single step.

30. The process of claim 20, further including removing the first insulating layer before forming the second insulating layer.

31. A process of forming a semiconductor device, comprising:

forming an insulating layer over a substrate;

forming a patterned mask over the first insulating layer;

forming at least one trench in a substrate using the patterned mask, the trench defining an isolation region for isolating active regions;

removing the patterned mask and the insulating layer;

forming an oxide layer in the trench and over substrate regions adjacent the trench after removing the patterned mask and the insulating layer;

depositing a nitride layer over the oxide layer, the nitride layer being deposited in the trench and over substrate regions adjacent the trench leaving an unfilled portion of the trench; and depositing a insulating layer over the nitride layer, the insulating layer being deposited in the unfilled portion of the trench and over the substrate regions adjacent the trench to form an oxide region in the trench over the nitride layer;

wherein the oxide layer, the deposited nitride layer, and the insulating layer form, at least in part, the isolation region.

* * * * *